(12) United States Patent
Eberlein et al.

(10) Patent No.: US 6,524,758 B2
(45) Date of Patent: Feb. 25, 2003

(54) METHOD OF MANUFACTURE OF PRINTED WIRING BOARDS AND FLEXIBLE CIRCUITRY

(75) Inventors: Dietmar C. Eberlein, Wappingers Falls, NY (US); Robert H. Detig, New Providence, NJ (US)

(73) Assignee: Electrox Corporation, Denville, NJ (US)

( * ) Notice: Subject to any disclaimer, the term of this patent is extended or adjusted under 35 U.S.C. 154(b) by 0 days.

(21) Appl. No.: 09/740,680

(22) Filed: Dec. 19, 2000

(65) Prior Publication Data

US 2002/0034617 A1 Mar. 21, 2002

Related U.S. Application Data

(60) Provisional application No. 60/172,618, filed on Dec. 20, 1999.

(51) Int. Cl.$^7$ .................................................. G03C 3/00
(52) U.S. Cl. ........................... 430/11; 430/16; 428/209
(58) Field of Search ............................ 430/49, 11, 16; 428/209

(56) References Cited

U.S. PATENT DOCUMENTS

| | | | |
|---|---|---|---|
| 4,732,831 A | * 3/1988 | Riesenfeld et al. | 430/49 |
| 5,011,758 A | 4/1991 | Detig et al. | |
| 5,106,537 A | 4/1992 | Nelsen et al. | |
| 5,389,270 A | 2/1995 | Thorn et al. | |
| 5,470,644 A | 11/1995 | Durant | 428/209 |
| 5,476,580 A | 12/1995 | Thorn et al. | |
| 5,618,400 A | 4/1997 | Florio et al. | |
| 5,635,000 A | 6/1997 | Casey et al. | |
| 5,817,374 A | * 10/1998 | Detig et al. | 427/466 |
| 5,891,543 A | 4/1999 | Casey et al. | 428/76 |
| 6,143,356 A | 11/2000 | Jablonski | |
| 6,153,348 A | 11/2000 | Kydd et al. | 430/119 |
| 6,171,740 B1 | * 1/2001 | Fonash et al. | 430/52 |

* cited by examiner

*Primary Examiner*—Cathy Lam
(74) *Attorney, Agent, or Firm*—Kenyon & Kenyon

(57) ABSTRACT

The present invention relates to the fabrication process for the printed wiring boards and flex circuits. An electrostatic printing plate includes a substrate with an image receiving layer applied thereto. The image receiving layer is a toner with a metallic toner and subsequently fixed in place or is transferred to a layer. The metal toner is then fixed on this receiving surface.

7 Claims, 3 Drawing Sheets

METHOD OF MANUFACTURE OF PRINTED WIRING BOARDS AND FLEXIBLE CIRCUITRY

RELATED U.S. APPLICATION DATA

This application claims the benefit of U.S. Provisional Application 60/172,618, filed Dec. 20, 1999.

FIELD OF THE INVENTION

The present invention relates to printed wiring boards and flexible circuitry and, more particularly, relates to methods of manufacture of novel and inexpensive printed wiring boards and flexible circuitry. The invention discloses a direct mode and a transfer mode of making the inexpensive printed wiring boards.

BACKGROUND OF THE INVENTION

World wide the printed wiring board (PWB) and flexible circuit industry is about a $25 billion business. Methods for manufacturing printed wiring boards and flexible circuits have remained largely unchanged since the industry's origin in the 1950s. The fabrication process, generally known as photo-lithography, is largely a subtractive process: broad area copper foil is first protected by a pattern etch-resistant resin; and then the remaining unprotected area on the copper foil is etched away, usually by a liquid/chemical etching process. This method involves numerous time-consuming and costly intermediate steps. Before the copper is etched, the resist must be laminated, exposed, and developed before the copper can be etched. In addition, the resist on the copper surface must be stripped after the etching process is completed. Finally, the entire board must be washed, dried, cured, and baked at various times during the fabrication process. Despite the tedious and time-consuming nature of the process, photo-lithography is the dominant fabrication process in both the printed wiring board and flexible circuit industry and in the semiconductor industry.

Electrostatic printing, sometimes referred to as Xeroprinting, typically utilizes an electrostatic printing plate or roll including a grounded conductive substrate with a permanent (persistent or fixed) image or pattern of insulating material formed thereon. A common method of forming the permanent image or pattern on the surface of the conductive substrate is to deposit a photosensitive polymer layer, also referred to as a photo-polymer layer, on the surface of the conductive substrate, such as disclosed in U.S. Pat. No. 4,732,831 to Riesenfeld, et al. Such layer is typically 5 to 50 $\mu$ thick. The photo-polymer is exposed to actinic radiation in a desired image or pattern causing the photo-polymer to selectively increase its resistivity, producing a persistent image on the electrostatic printing plate. Thereafter, the electrostatic printing plate is charged using corona discharge, causing the latent, high resistivity, insulating areas to build a static charge, while areas of low resistance discharge comparatively quickly. The image is developed for transfer to another surface by toning with oppositely charged particles of toner, in liquid or dry form. The toner is then transferred by electrostatic or other means to another surface such as paper, polymeric film or phenolic resin. Since the original image is fixed in the photo-polymer layer, multiple copies can be made with a single exposure of the photo-polymer by merely repeating the corona charging, toning and transfer steps.

A mask or photo-tool may be utilized to expose the electrostatic printing plate to light. When the photo-polymer layer of the printing plate is exposed to actinic radiation through the mask or photo-tool, the polymeric molecules of the photo-polymer become cross-linked in the pattern exposed and an image or pattern is developed in the photo-polymer. When the electrostatic printing plate is charged with a corona unit, of the type known in the art, the cross-linked regions of photo-polymer retain a high level of electrostatic charge, but the unexposed, uncross-linked regions quickly dissipate the charge. Alternatively, a photo-polymer may be selected that reduces cross-linking when exposed to actinic radiation, which likewise produces a persistent image or pattern of contrasting high-resistivity and low-resistivity regions on the surface of the electrostatic printing plate.

Over the years, there have been numerous attempts to improve on the subtractive photolithographic processes. These attempts have focused on either improving the liquid etching process, or sidestepping the etching process entirely by developing an "additive" fabrication process. However, the improved etching baths build up with metal sludge, and need to be periodically disposed of and replaced at considerable cost. The attempts at developing an additive process use many "electroless" plating steps and involve toxic and complex chemistries. The electroless plating steps are generally slow and produce copper of poor quality, resulting in a lower quality board and are incapable of producing thick copper layers.

Accordingly, prior to the development of the present invention, there has been no method for manufacturing high-quality printed wiring boards and flexible circuits in a quick and efficient manner at low cost.

SUMMARY OF THE INVENTION

The invention describes inexpensive methods for manufacturing printed wiring boards and flexible circuits. Specifically, an electrostatic printing plate is employed and used as an imaginable dielectric to which an electrically conductive toner, such as, a silver toner, is applied. The toner is then cured. Finally, bulk conductor metal, preferably copper, is electroplated on the silver toner conductor patterns to finish the process. Alternatively, the silver toner is transferred directly to a dielectric surface and processed to form the PWB or the flexible circuit.

It is an object of the present invention to selectively form a toner layer pattern on an electrostatic printing plate on which a copper layer is formed.

The electrostatic printing plate can be rigid or flexible and is coated with an image receiving layer. The image receiving layer is preferably comprised of a photopolymer material.

The invention also relates to an electrostatic printing plate or drum that is fabricated using a process that causes an amorphous, insulating layer to selectively crystallize in a desired pattern, which can then be used to repeatedly transfer dry or liquid toner to a receiving surface.

In one preferred embodiment, an electrostatic printing plate includes a metal substrate with at least one photopolymer layer deposited thereon. A silver containing toner is subsequently deposited on the photopolymer layer in a desired image. The photopolymer material layer can then be heated to an adequate temperature for the desired time causing a pattern to develop in the photopolymer layer. The resulting layer is highly durable and allows millions of images to be transferred from a single electrostatic plate or drum.

Alternatively, a mask could be used to selectively deposit quantities of toner, such as, a silver toner, on the surface of either the substrate or the photopolymer material layer.

The present invention is further directed to a method of fabricating the electrostatic printing plate.

Further objects and advantages of the present invention will be apparent to those skilled in the art from the detailed description of the disclosed invention.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
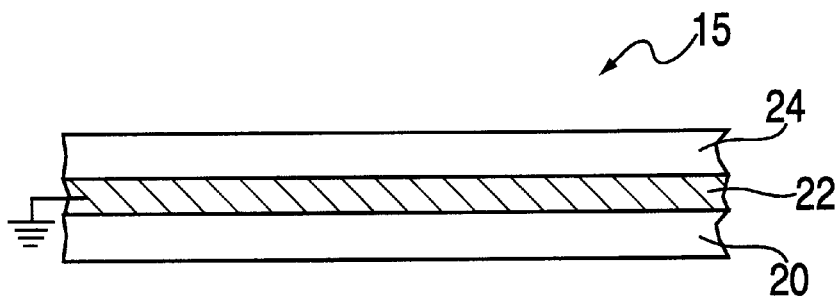
FIGS. 1 through 4 are a cross-sectional view of the printed wiring board structure produced by the preferred embodiment of the invention.

The preferred embodiment of the invention is illustrated with reference to FIGS. 1 through 4. In FIG. 1 a printed wiring board 15 of the preferred embodiment consists of a substrate 20, an electrical ground plane layer 22, which acts as an anti-static layer and a photo imaginable dielectric layer 24, which acts as an electrostatic printing plate layer having a top protective or backing layer which is removed before any processing of the printed wiring board. The board 15 can be either a flexible or a rigid printed wiring board 15. The ground plane layer 22 can be eliminated if the substrate 20 itself is comprised of an electrically conductive material like steel, aluminum, conductive treated paper or Formica laminate materials. The dielectric layer 24 is preferably coated onto the substrate 20.

Figure 2:
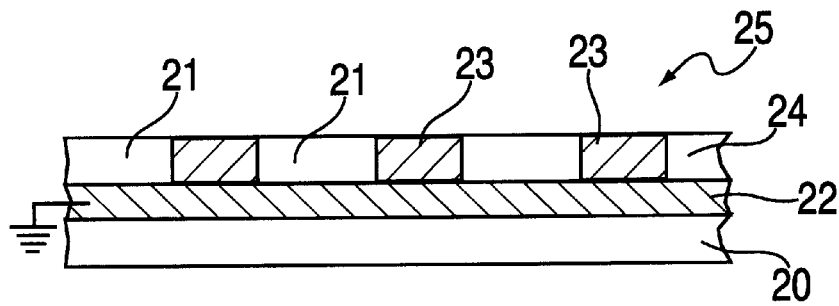

The printed wiring board 15 is then imaged by photo and exposure tools by methods well known to those skilled in the art, as shown in FIG. 2. Next, the dielectric layer 24 is stripped of its top protective or backing layer and sensitized, preferably by charging it with a corona unit. The background areas of the dielectric layer 24 may be cross-linked in order to create a more robust final product if so desired. The cross-linking of the imaged photo imaginable dielectric layer 24 would create a cross-linked regions 23 and a non-cross-linked region 21.

Figure 3:
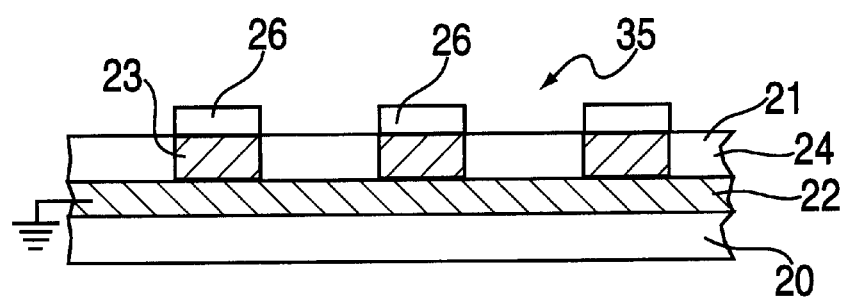

The printed wiring board 25 is then electrostatically charged and a silver toner layer 26 is formed over the cross-linked regions 23 of the substrate, as shown in FIG. 3. Alternatively, the sensitized board 25 could be developed with a silver toner layer 26 and dried. It has been discovered that the silver toner 26 has non-affinity for the non-cross-linked region 21, and thus no layer or film of the silver toner 26 will be formed over region 21. The resulting silver toner imaged plate or layer 26 is heated, preferably at about 125° C., for a period of time. The combination of heat and the active surface monomers of the photo-polymer printing plate material 24 effectively cure the silver toner 26 to a solid mass at temperatures well below its normal cure temperature of about 230° C. resulting in the board 35.

Figure 4:
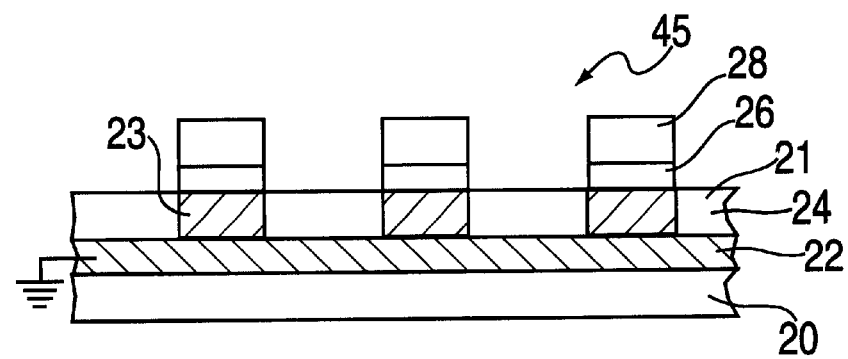

Finally, as shown in FIG. 4, using the board 35 the resulting silver conductor patterns 26 are electroplated up with at least one copper layer 28, to the desired thickness and conductivity values, thus producing an electroplated copper layer 28. This allows metal layers 28 that are much thicker that those created from one image of relatively small particle liquid toner 26. In addition, covering the silver conductor patterns 26 with copper 28 solves the "dentrite growth" problem caused when pure silver 26 picks up moisture from the air. Finally, electroplated copper layer 28 facilitates soldering of wires and other components to the printed wiring board 45, thereby avoiding the problems associated with soldering items to silver.

Some of the advantages of the preferred embodiment are:

1. Since no transfer step is involved, very high resolution or fine feature sizes are possible.

2. Very low capital equipment costs are needed to support this manufacturing process. Substrates can be sold pre-laminated with printing plate material. The customer needs only an exposure tool (which he already possesses) and a simple charge/toner/drying assembly (a low cost item) to be in operation.

A First Alternate Embodiment of the Invention

In this embodiment of the invention no heat processing of the silver toner is involved. This embodiment involves the direct imaging of the printing plate 25 with the toner 26 and the toner 26 is fixed in place; and no transfer is involved.

The plate 15 is made as in the preferred embodiment. The plate could be a conducting substrate 20, or an anti-static layer 22 coated onto an insulating substrate 20, coated with the photo imaginable dielectric layer 24 as in FIG. 1 and then exposed by normal means. The plate 25 is sensitized by a corona unit and developed with silver toner 26, then dried.

The plate 25 is now exposed to UV radiation which photo triggers the chemical reaction which causes the organo-metallic compound coating the silver particles to decompose to atomic silver and carbon dioxide plus water. This "atomic" silver bonds the metallic silver particles together into a solid, continuous mass which is electrically continuous or conductive.

UV curing of inks is an important industrial process in the graphic arts and electronic packaging industries. The elimination of the heating step can have important advantages especially in applications where the substrate cannot withstand even a low temperature heating step like 125° C. or where the heating is not allowed as the substrate will thermally expand thereby destroying attempts and accurate overlays of multiple layers.

A Second Alternate Embodiment of the Invention

An alternate embodiment of the invention is where one transfers the toner from a reusable imaging surface to a receiving surface for further processing. The receiving surface becomes part of the final product; either a rigid printed wiring board or, a flexible electronic circuit.

Figure 5:
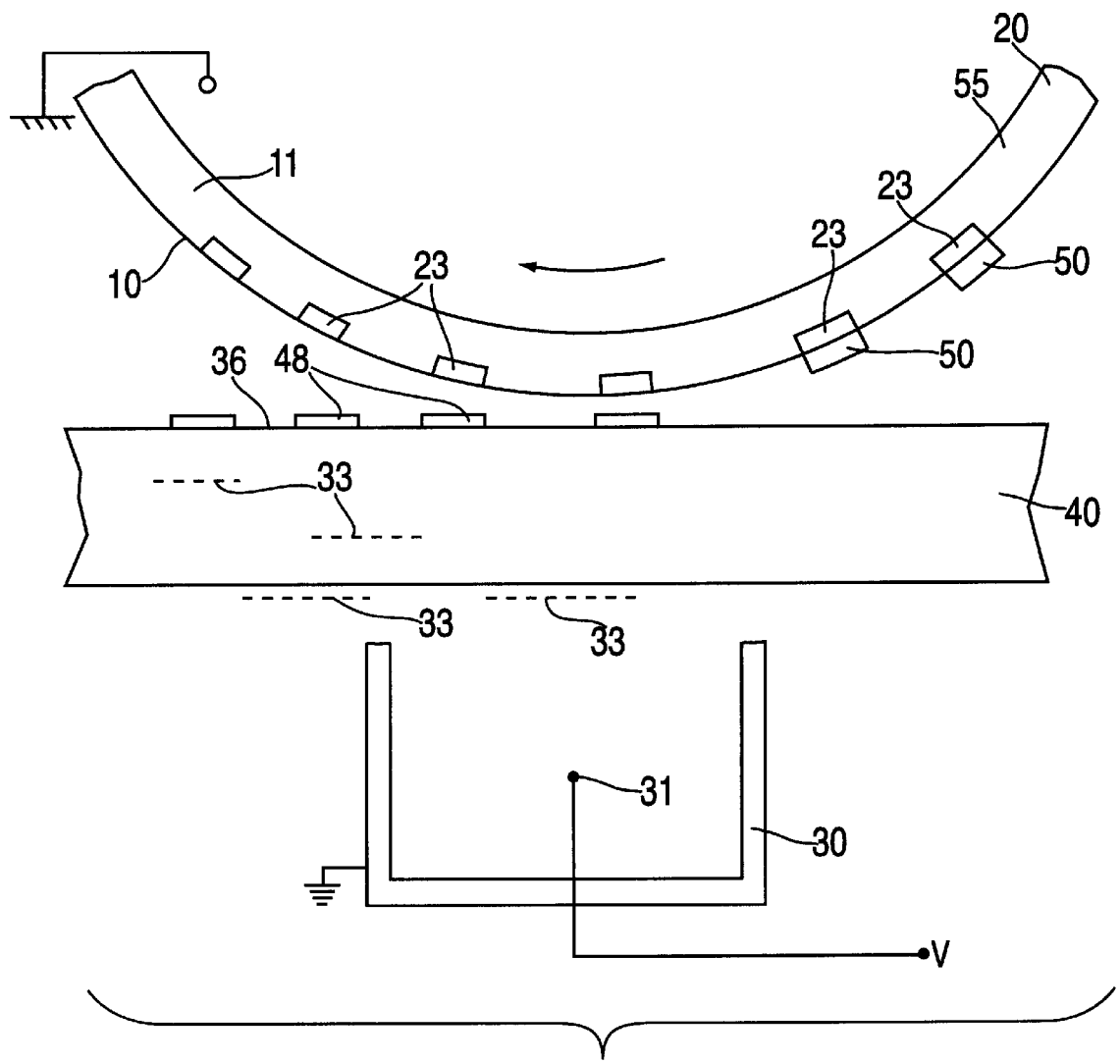
FIG. 5 is a cross-sectional view of an alternate embodiment of the invention where the toner is transferred directly onto the receiving surface.

In FIG. 5 an image surface 10, which is made by the process illustrated in FIGS. 1 through 2 is wrapped around a drum 11 or a part of a printing plate 11. The image surface 10 is then sensitized by a corona discharge, not shown; and is subsequently developed by toner particles 50. The toner particles 50 will adhere to the cross-linked region 23. These toner particles 50 are then transferred to a receiving surface 36 under the action of a corona discharge from wire 31 contained in the housing 30, and the transferred toner particles 48 are held to receiving surface 36 by attraction of electrostatic charges 33. If the toner particles 50 are assumed to be positive, then a negative transfer corona is required. Of course, the toner particles 50 can be negative, which would require a positive transfer corona.

The image surface 10 is of a fixed image configuration. The toner image on the image surface 10 is created by means common to the art; then, the toner image is transferred to a suitable receiving surface 36 by electrical fields or by surface energy/thermal adhesion means (silicone or fluoro-silicone elastomer roller or blankets). With liquid toner 50, electrostatic transfer across quite large gaps (250 microns or more is possible or alternately transfer of the toner 50 can occur in "virtual" contact (i.e. across very small mechanical gaps, generally less than 5 microns). After the transfer of the toner particles 50 to the receiving surface 36, the toner particles 50 dry and are temporarily "fixed" in place. The toner particles 50 are then processed in an oven for the appropriate period of time. Finally, it is coated with a copper plate as illustrated with reference to FIG. 4 to a suitable thickness and electrical conductivity.

This alternative embodiment allows the photo-polymer printing plate 55 to be re-used, thereby reducing costs. In addition, this embodiment allows for a wider choice of properties for the receiving surface 36, in order to customize for various applications. Lastly, this embodiment can be fabricated using "tool-less" manufacturing processes, which permits custom manufacturing processes that use scanned laser- or light emitting diodes to expose the drum or a photo sensitive plate to a data "bitmap" from the data processor.

A Third Alternate Embodiment of the Invention

Another alternate embodiment of the invention is where one transfers the toner from a reusable imaging surface to a receiving surface for further processing. The receiving surface becomes part of the final product; either a rigid printed wiring board or, a flexible electronic circuit.

Figure 6:
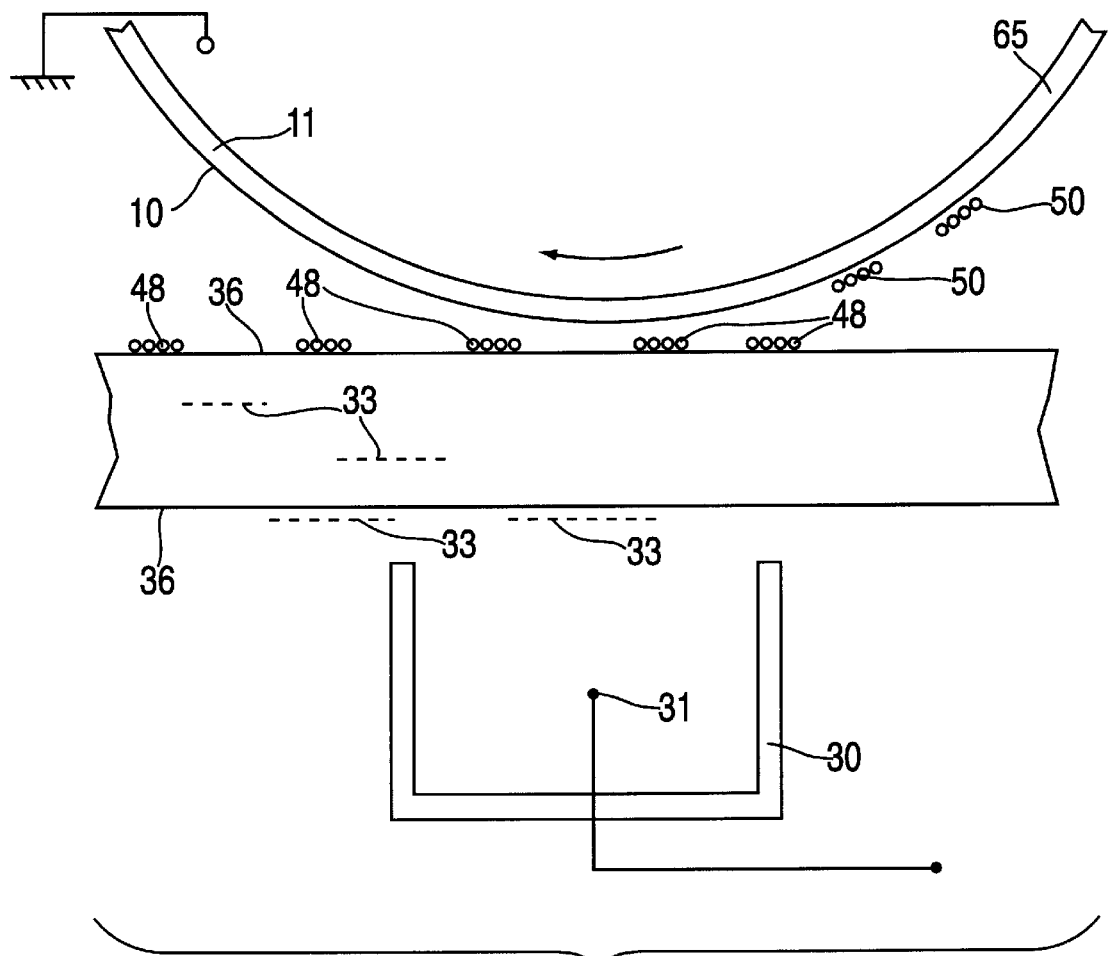
FIG. 6 is a cross-sectional view of another alternate embodiment of the invention where the toner is transferred directly onto the receiving surface.

In FIG. 6 an image surface 10 is wrapped around a drum 11 or is a part of a printing plate 11. The image surface 10 is then sensitized by a corona discharge, not shown; and is subsequently developed by toner particles 50. These particles 50 are then transferred to a receiving surface 36 under the action of a corona discharge from wire 31. The transferred toner particles 48 are held to receiving surface 36 by attraction of electrostatic charges 33. If the toner particles 50 are assumed to be positive, then a negative transfer corona is required. Of course, the toner particles 50 can be negative, which would require a positive transfer corona.

The image surface 10 can either be of fixed image configuration or electronically addressable by means of an ionographic print head, such as what is seen in a Delfax machine or an optically addressable print head onto a photo sensitive surface. The toner image 50 is created by means common to the art; then, the toner image 50 is transferred to a suitable receiving surface 36 by electrical fields or by surface energy/thermal adhesion means (silicone or fluoro-silicone elastomer roller or blankets). With liquid toner 50, electrostatic transfer across quite large gaps (250 microns or more is possible or alternately transfer of the toner 50 can occur in "virtual" contact (i.e. across very small mechanical gaps, generally less than 5 microns). After the transfer of the toner particles 50 to the receiving surface 36, the toner particles 50 dry and are temporarily "fixed" in place. The toner particles 50 are then processed in an oven for the appropriate period of time. Finally, it is coated with a copper plate as discussed earlier to a suitable thickness and electrical conductivity.

This alternative embodiment allows the photo-polymer printing plate 65 to be re-used, thereby reducing costs. In addition, this embodiment allows for a wider choice of properties for the receiving surface 36, in order to customize for various applications. Lastly, this embodiment can be fabricated using "tool-less" manufacturing processes, which permits custom manufacturing processes that use scanned laser- or light emitting diodes to expose the drum of a photo sensitive plate to a data "bitmap" from the data processor.

Optionally, the toner metal traces could be electroplated with copper to provide thicker cross sections which would be capable of higher electrical currents and also to provide traditional copper technology which is well known and accepted for the manufacturing of the printed wire boards and flexible circuitry. Also the metal patterns that are electroplated on top of the toner layer provide for a more robust and thicker layer, as well as, provide the desired copper metal technology.

The printed wire boards or flex circuits that are formed on a substrate using this invention may contain at least one anti-static layer of very low electrical conductivity so that RF antenna that is printed there on will suffer low losses because of the very low electrical conductivity of the substrate. However, for some applications the substrate has an adequate electrical conductivity and therefore no anti-static coating is needed.

The material for the substrate could be selected from a group comprising an electrically conductive material, a paper sheet, a metal foil, aluminum, anodized aluminum, ITO-coated polymeric film, steel, electrically conductive treated paper and Formica laminate materials. The substrate could also be a high pressure laminate.

The toner on top of the substrate could also contain at least one coating that promotes low temperature sintering of the metal toner. The coating could be a resin from the Saran, TN, family of resins from the DOW Chemical Co., Midland, Mich. The coating could be a resin of the Saran family designated F-276. Preferably, the toner is made from an electrically conductive material or it could be an electrically conductive metal.

The present invention also relates to an electrostatic printing plate or drum that is fabricated using the inventive process that causes the formation of cross-linked and non-cross-linked regions in a desired pattern on a substrate, which can then be used to repeatedly transfer dry or liquid toner to a receiving surface.

The substrate is preferably from about 0.05 to about 10 millimeters thick and the image receiving layer is preferably about 25 to about 250 microns thick.

While the present invention has been illustrated herein for a metal substrate with a silicon film or coating, it is to be understood that other amorphous, image receiving films could be substituted for silicon and other trace particles substituted for the palladium nucleant, and this would remain within the scope of this invention. For example, selenium, selenium/tellurium alloys, arsenic tri-selenide could be used for the amorphous, insulating film. Also, by way of example, nucleating particles could include tin, mercury, platinum, nickel, silver and gold.

Also included within the scope of the present invention are durable, electrostatic printing plates that include a substrate including an insulating layer (e.g., glass, alumina or quartz) coated with a conductive layer (e.g., chrome, aluminum, or ITO). In such embodiment, the image receiving layer is applied to the conductive layer and the poly-crystalline and amorphous regions are formed thereon.

As used herein, the term permanent pattern refers to a pattern or image that persists for the useful life of the electrostatic printing plate. However, one skilled in the art would understand that a permanent pattern could be capable of being altered, erased or reconditioned by treating the surface chemically, thermally or both. The permanence of the image merely refers to the ability of the layer to persist for repeated transfer of images to a receiving surface without re-treatment or re-exposure of the surface.

EXAMPLES

The following examples are intended to further illustrate the invention and are not intended to limit the scope of the invention in any manner.

Example 1

Interlayer laminate of FR-4, which is about 0.010" thick is coated on one side with anti-static paint #4601 (Anti Static Indus. Hackensack, N.J.) to an approx. thickness of 20 microns. To this is laminated "soldermask" photo-polymerprintingplate material Laminar #5038 (Morton Dyna Chem; Tustin. Calif.) which is about 75 microns thick. The printing plate material is exposed to actinic radiation in about 300 to about 400 nm region through a negative photo-tool by ordinary exposure means. Exposure levels are of the order of about 50 mj/cm$^2$. The printing plate material is now imaged by stripping off the top backing or protective layer of photopolymer material, sensitizing by corona charging it to between about 800 and about 1000 v in the images area, then developing it with toner of the following formula:

55 ml Isopar L (Trademark of Exxon Corp.)

5 ml Parmod #72-10 (Trademark of Paralec)

¾ ml Indigo Imaging Agent, diluted 10×.

The conductivity of this toner is approx. 7.25 pico mhos/cm when measured with the Scientifica Model 627 meter. After the toner is dried, the unexposed regions are cured by a flood exposure of UV light in the 300 to 400 nm region. Now the toner and photo polymer printing plate material is finally cured by heating to about 125° C. for about 2 hours and 40 minutes in a normal atmosphere environment. The silver toner conductor patterns are solid, well adhered to the plate and demonstrates an electrical conductivity of between about 10 to about 30% that of the same silver cured at the normal 230° C. for about 2 min. The Ag patterns are now electroplated with copper by ordinary means.

Example 2

A 175 micron thick photopolymer material film is coated with the anti-static paint of Example 1. It is coated with the photo-polymer Laminar #5038 by ordinary laminating means. It is further imaged by the means of Example 1. Finally it is imaged and processed by the techniques of Example 1 and excellent Ag toner images result. Then these Ag metal patterns are Cu electroplated as in Example 1. Excellent copper conductor patterns result.

Example 3

Iridium tin oxide coated photopolymer material film OC-300/500 of CPF films of Riverside, Calif. consists of 125 micron thick photopolymer material film sputter coated with indium tin oxide (ITO) to a conductivity value of 500 ohms per square of surface area. It is laminated, processed and then cured as in Example 1. Excellent copper images result on an optically transparent surface.

Example 4

The printing plate material of Example 1 is laminated to about 1 mm thick black anodized aluminum plate (Lawrence & Frederick; Chicago, Ill.). No anti-static coating is needed as the anodizing layer is essentially electrically conducting for purposed of electrostatic process. It was laminated, processed and plated as in Example 1. Excellent conductor patterns resulted.

Example 5

Paper about 0.008" thick (Westvaco Advantage, coated on side) is laminated as in Example 1. This is imaged and processed as in Example 1. Excellent images result.

Example 6

High pressure laminate Formica (Trademark) #7008-43 is laminated with Laminar #5038 as in Example 1 and are processed as in Example 1. Excellent copper images result.

Example 7

An electrostatic printing plate is made by laminating Dyna Chemical #5038 photo polymer dry film resist to an (Indium Tin Oxide) coated glass, about 3 mm thick. It is exposed with a negative photo tool to actinic radiation in about 300 to about 400 nm region at a level of about 100 millijoules per cm$^2$. After stripping away the backing or protective top layer of photopolymer material film, it is sensitized by corona charging with a positive corona discharge. The 5038 photo-polymer (about 38 microns thick) typically charges to a level of between about +800 to about +1000 volts. It is now developed with Paralec LLC, Parmod toner #72-10 at about 1% concentration with a conductivity in the range of between about 6.5 to about 7.5 pico mhos per cm. The silver Parmod toner is transferred to Du Pont MC 2/100 food packaging film. This is a photopolymer material film of thickness of about 0.00092. It is aluminized on one side and is then coated on both sides with DOW Saran resin #469 with about one micron thickness. Transfer is achieved by corona charging the back of the film. This image after drying is heat processed by heating through the back side of the film at about 125° C. for about 2 min. Excellent silver metal image result. They are subsequently plated with copper by conventional means.

Example 8

The plate of Example 7 is toned with the silver toner as before. This toner is then transferred by means of corona transfer to the following top layer, Saran wrap TM which is about 15 micron thick. Support layer 3M laminating film #7783, approximately 60 micron thick is used. The toner is heat processed by heating the film laminate to about 128° C. for about 2 minutes. Good, conductive images result.

Example 9

The toner from the plate of Example 8 is transferred to Arkwright TX-703 copier transparency film. This is 75 micron photopolymer material coated on both side with a heat sealable resin. The toner is processed at about 120° C. for about 30 min. Superior image result.

Example 10

Parmod silver toner of Example 7 is installed in a Saran Model 7350 liquid toner copy machine. Positive artwork of the silver metal patterns to be printed is placed on the platen of the copier. Artwright TX-703 copier transparency film is loaded into the paper tray of the machine. Excellent images of dried Parmod silver toner are produced. These are later sintered in an oven at about 120° C. for about 30 minutes, to yield excellent silver conductivity.

Example 11

A Fujitsu F6774 E/F printer is modified to accept liquid toner. This machine is a 400 dpi, 50 page per minute printer that uses a 108 mm diameter by 370 mm long amorphous silicon drum. The machine has a print width of 300 mm. A Pentium III PC with PADS software feeds data to the F6774 (modified) printer. Artwright, Fisherville, R.I. TX-703 is prepared in edge punched and sheet perforated form so that the machine can handle this web. The Parmod silver toner of Example 7 is loaded into the machine and excellent dried silver toner images emerge from the machine. These are sintered into solid metal by heating at about 120° C. for about 30 minutes.

Example 12

ITO coated photopolymer material film of Example 3 is laminated with Dyna Chem Dyna Mask 5030 and imaged at an exposure of about 300 mjoules/cm$^2$. It is charged and toned as in Example 1. After drying it is exposed to UV radiation in the UVC region from two GE-C8T5 lamps at a distance of about 8 inches for about one hour. Good electrical conductivity of the silver was measured.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A printed wiring board comprising a substrate; a photo imaginable dielectric layer coated onto the substrate, wherein at least a portion of the dielectric layer is cross-linked and wherein the cross-linked portion has a toner adhered thereto, wherein the toner comprises a member selected from the group consisting of silver and silver alloys.

2. The printed wiring board of claim 1, further comprising an electrical ground plane layer between the substrate and the dielectric layer, wherein the ground plane layer acts as an anti-static layer.

3. The printed wiring board of claim 1 wherein the toner has a layer of copper adhered thereto.

4. The printed wiring board of claim 1 wherein the toner layer is between about 0.1 micron and about 100 microns thick.

5. The printed wiring board of claim 1 wherein the toner has a layer of copper adhered thereto, and wherein the copper layer is between about 0.1 micron and about 100 microns thick.

6. The printed wiring board of claim 1 wherein the substrate is selected from the group consisting of an electrically conductive material, a paper sheet, a metal foil, an ITO-coated polymeric film, and a mica containing laminate material.

7. The printed wiring board of claim 1 wherein the dielectric layer comprises a photo-polymeric material.

* * * * *